United States Patent
Zhong et al.

(10) Patent No.: US 8,748,983 B2
(45) Date of Patent: Jun. 10, 2014

(54) EMBEDDED SOURCE/DRAIN MOS TRANSISTOR

(75) Inventors: Huicai Zhong, San Jose, CA (US); Chao Zhao, Kessel-lo (BE); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 257 days.

(21) Appl. No.: 13/380,828

(22) PCT Filed: Aug. 12, 2011

(86) PCT No.: PCT/CN2011/078320
§ 371 (c)(1),
(2), (4) Date: Dec. 24, 2011

(87) PCT Pub. No.: WO2012/145976
PCT Pub. Date: Nov. 1, 2012

(65) Prior Publication Data
US 2012/0273886 A1    Nov. 1, 2012

(30) Foreign Application Priority Data
Apr. 29, 2011   (CN) .......................... 2011 1 0112309

(51) Int. Cl.
*H01L 27/12* (2006.01)
*H01L 21/70* (2006.01)

(52) U.S. Cl.
USPC ..... 257/347; 257/520; 257/521; 257/E29.255

(58) Field of Classification Search
None
See application file for complete search history.

(56) References Cited

U.S. PATENT DOCUMENTS

| 7,838,887 | B2 | 11/2010 | Woon et al. | |
|---|---|---|---|---|
| 7,951,657 | B2 | 5/2011 | Cheng et al. | |
| 2004/0094758 | A1* | 5/2004 | Usuda et al. | 257/18 |
| 2009/0273034 | A1 | 11/2009 | Woon et al. | |
| 2010/0295127 | A1 | 11/2010 | Cheng et al. | |
| 2011/0027955 | A1 | 2/2011 | Woon et al. | |
| 2011/0204384 | A1 | 8/2011 | Cheng et al. | |
| 2012/0021584 | A1* | 1/2012 | Wang et al. | 438/301 |
| 2012/0126295 | A1* | 5/2012 | Edge et al. | 257/288 |

FOREIGN PATENT DOCUMENTS

| CN | 101572269 A | 11/2009 |
|---|---|---|
| JP | 1268061 A | 10/1989 |
| JP | 2009176876 A | 8/2009 |

* cited by examiner

*Primary Examiner* — Michael Jung
(74) *Attorney, Agent, or Firm* — Goodwin Procter LLP

(57) ABSTRACT

An embedded source/drain MOS transistor and a formation method thereof are provided. The embedded source/drain MOS transistor comprises: a semiconductor substrate; a gate structure on the semiconductor substrate; and a source/drain stack embedded in the semiconductor substrate at both sides of the gate structure with an upper surface of the source/drain stack being exposed, wherein the source/drain stack comprises a dielectric layer and a semiconductor layer above the dielectric layer. The present invention can cut off the path for the leakage current from the source region and the drain region to the semiconductor substrate, thereby reducing the leakage current from the source region and the drain region to the semiconductor substrate.

7 Claims, 4 Drawing Sheets

EMBEDDED SOURCE/DRAIN MOS TRANSISTOR

This application is a National Phase application of, and claims priority to, International Application No. PCT/CN2011/078320 filed on Aug. 12, 2011, which claimed priority to Chinese Application No. 201110112309.6 filed on Apr. 29, 2011. Both the international application and the Chinese application are incorporated herein by reference in their entireties.

FIELD OF THE INVENTION

The present invention relates to the field of semiconductor technology, and in particular to an embedded source/drain MOS transistor and a formation method thereof.

BACKGROUND OF THE INVENTION

With the development of semiconductor manufacturing technology, critical dimension (CD) of semiconductor devices is continuously shrinking. In order to solve the problems of power consumption and response time of small-sized devices, techniques such as gate-last and embedded source/drain device have been widely used.

FIG. 1 is a cross-sectional structural diagram of an embedded source/drain MOS transistor in the prior art, comprising: a semiconductor substrate 10; a shallow trench isolation (STI) structure 11 formed in the semiconductor substrate 10; a gate structure 12 formed on the semiconductor substrate 10, wherein the gate structure 12 comprises a gate dielectric layer 12a on the semiconductor substrate 10, a gate electrode 12b on the gate dielectric layer 12a and a spacer 12c enclosing the sidewalls of the gate dielectric layer 12a and the gate electrode 12b; and a source region 13 and a drain region 14 at respective sides of the gate structure 12, wherein the lattice constants of the source region 13 and the drain region 14 are larger than or less than the lattice constant of the semiconductor substrate 10.

A method for forming the source region 13 and the drain region 14 mainly comprises: when the gate structure 12 has been formed, etching the semiconductor substrate 10 at both sides of the gate structure 12 to form an opening, then filling the opening to form the source region 13 and the drain region 14, by epitaxial growth. Generally, the material of the semiconductor substrate 10 is monocrystalline silicon, and for PMOS transistors, the material filled to form the source region 13 and the drain region 14 may be germanium-silicon (SiGe), which has a lattice constant larger than the lattice constant of monocrystalline silicon, and can produce compressive stress in the channel between the source region 13 and the drain region 14, and improve hole mobility; and for NMOS transistors, the material filled to form the source region 13 and the drain region 14 may be silicon carbide (SiC), which has a lattice constant less than the lattice constant of monocrystalline silicon, and can produce tensile stress in the channel between the source region 13 and the drain region 14, and improve electron mobility.

Moreover, in order to further reduce the source/drain contact capacitance and improve device performance, the source region 13 and the drain region 14 are normally formed with their surfaces higher than the surface of the semiconductor substrate, resulting in a raised source/drain structure. However, in any of the structures above, as the size of the device continues to shrink, leakage current $I_{leak}$ from the source region 13 and the drain region 14 to the semiconductor substrate 10 becomes considerably larger, and performance of the device is significantly degraded.

SUMMARY OF THE INVENTION

An object of the present invention is to provide an embedded source/drain MOS transistor and a formation method thereof, to reduce the leakage current from the source region and the drain region to the semiconductor substrate.

In order to solve the problems above, according to the present invention, it is provided an embedded source/drain metal-oxide-semiconductor (MOS) transistor comprising:
 a semiconductor substrate;
 a gate structure on the semiconductor substrate; and
 a source/drain stack embedded in the semiconductor substrate at both sides of the gate structure with an upper surface of the source/drain stack being exposed, wherein the source/drain stack comprises a dielectric layer and a semiconductor layer above the dielectric layer.

Optionally, the material of the dielectric layer and/or the semiconductor layer comprises crystal materials.

Optionally, the semiconductor layer is P-type doped, and the dielectric layer and/or the semiconductor layer has a lattice constant larger than that of the semiconductor substrate.

Optionally, the semiconductor layer is N-type doped, and the dielectric layer and/or the semiconductor layer has a lattice constant less than that of the semiconductor substrate.

Optionally, the material of the dielectric layer comprises crystalline gadolinium oxide ($Gd_2O_3$) or crystalline neodymium oxide ($Nd_2O_3$).

Optionally, an upper surface of the semiconductor layer is flushed with or higher than an upper surface of the semiconductor substrate.

Optionally, the semiconductor layer extends to under the gate structure.

Optionally, sidewalls of the semiconductor layer comprise an upper sidewall and a lower sidewall connected with each other, and the connection between the upper sidewall and the lower sidewall protrudes outwards from the semiconductor layer.

Optionally, the semiconductor substrate is a silicon-on-insulator (SOI) substrate, and the silicon-on-insulator substrate comprises a substrate, a buried insulating layer on the substrate and a surface semiconductor material layer on the buried insulating layer, the gate structure is formed on the surface semiconductor material layer, and the source/drain stack is embedded in the surface semiconductor material layer on the buried insulating layer, or penetrates through the surface semiconductor material layer and the buried insulating layer.

According to the present invention, it is also provided a method for forming an embedded source/drain metal-oxide-semiconductor (MOS) transistor, comprising:
 providing a semiconductor substrate;
 forming a gate structure on the semiconductor substrate;
 forming an opening in the semiconductor substrate at both sides of the gate structure, respectively; and
 filling the openings to form a source/drain stack, wherein the source/drain stack comprises a dielectric layer and a semiconductor layer above the dielectric layer.

Optionally, the material of the dielectric layer and/or the semiconductor layer comprises crystal materials.

Optionally, P-type doped ions are introduced in the forming of the semiconductor layer, and the dielectric layer and/or the semiconductor layer has a lattice constant larger than that of the semiconductor substrate.

Optionally, N-type doped ions are introduced in the forming of the semiconductor layer, and the dielectric layer and/or the semiconductor layer has a lattice constant less than that of the semiconductor substrate.

Optionally, the material of the dielectric layer comprises crystalline gadolinium oxide or crystalline neodymium oxide.

Optionally, the filling the opening to form a source/drain stack comprises:

filling the openings to form a dielectric layer;

etching a surface portion of the dielectric layer so that an upper surface of the remnant dielectric layer is lower than an upper surface of the semiconductor substrate; and forming a semiconductor layer on the remnant dielectric layer.

Optionally, the dielectric layer and the semiconductor layer are formed by epitaxial growth.

Optionally, an upper surface of the semiconductor layer is flushed with or higher than an upper surface of the semiconductor substrate.

Optionally, while etching a surface portion of the dielectric layer, the method further comprises: etching the semiconductor substrate at both sides of the opening, so that the opening above the remnant dielectric layer extends to under the gate structure.

Optionally, sidewalls of the opening above the remnant dielectric layer comprise an upper sidewall and a lower sidewall connected with each other, and the connection between the upper sidewall and the lower sidewall protrudes outwards from the semiconductor layer to the outside of the opening.

Optionally, the semiconductor substrate is a silicon-on-insulator (SOL) substrate, and and the silicon-on-insulator substrate comprises a substrate, a buried insulating layer on the substrate and a surface semiconductor material layer on the buried insulating layer, the gate structure is formed on the surface semiconductor material layer, and the opening is formed in the surface semiconductor material layer on the buried insulating layer, or penetrates through the surface semiconductor material layer and the buried insulating layer.

In comparison with the prior art, the embodiments of the present invention have the following advantages:

In the embedded source/drain MOS transistor and the formation method thereof according to the embodiments of the present invention, the source/drain stack at each of the sides of the gate structure comprises a dielectric layer and a semiconductor layer on the dielectric layer, with the semiconductor layer acting as a source/drain region, and the dielectric layer isolating the semiconductor layer on it from the semiconductor substrate under it, thereby reducing the leakage current from the source region and the drain region to the semiconductor substrate.

Furthermore, the material of the dielectric layer and/or the semiconductor layer is a crystal. For PMOS transistors, the lattice constant of the dielectric layer and/or the semiconductor layer is larger than the lattice constant of the semiconductor substrate, producing compressive stress; and for NMOS transistors, the lattice constant of the dielectric layer and/or the semiconductor layer is less than the lattice constant of the semiconductor substrate, producing tensile stress. This can improve carrier mobility and thus device performance.

In addition, the semiconductor layer extends to under the gate structure, and has a sidewall comprising an upper sidewall and a lower sidewall connected with each other, and the connection between the upper sidewall and the lower sidewall protrudes outwards. This facilitates generation of stress in the channel region in the semiconductor substrate, and can further improve carrier mobility.

BRIEF DESCRIPTION OF THE DRAWINGS

The above and other objects, features and advantages of the present invention will become more apparent when read in conjunction with the accompanying drawings, in which the same reference numerals denote the same components. The figures are not drawn to scale, in order to not unnecessarily obscure the essence of the present invention.

DETAILED DESCRIPTION OF THE INVENTION

With the continuous decrease of the size of devices, the leakage current from the source region and the drain region of a MOS transistor to the semiconductor substrate plays a bigger role in the performance of the device; and embedded source/drain MOS transistors and raised source/drain structures have the same problem.

In the embedded source/drain MOS transistor and the formation method thereof according to the embodiments of the present invention, the source/drain stack at each of the sides of the gate structure comprises a dielectric layer and a semiconductor layer on the dielectric layer, with the semiconductor layer acting as a source/drain region, and the dielectric layer isolating the semiconductor layer on it from the semiconductor substrate under it, thereby reducing the leakage current from the source region and the drain region to the semiconductor substrate.

Furthermore, the material of the dielectric layer and/or the semiconductor layer is a crystal. For PMOS transistors, the lattice constant of the dielectric layer and/or the semiconductor layer is larger than the lattice constant of the semiconductor substrate, producing compressive stress; and for NMOS transistors, the lattice constant of the dielectric layer and/or the semiconductor layer is less than the lattice constant of the semiconductor substrate, producing tensile stress. This can improve carrier mobility and thus device performance.

In addition, the semiconductor layer extends to under the gate structure, and has a sidewall comprising an upper sidewall and a lower sidewall connected with each other, and the connection between the upper sidewall and the lower sidewall protrudes outwards. This facilitates generation of stress in the channel region in the semiconductor substrate, and can further improve carrier mobility.

For a better understanding of the objects, features and advantages above of the present invention, the embodiments of the present invention will be described in details hereinafter with reference to the accompanying drawings.

In the following description, numerous specific details are set forth, in order to provide a thorough understanding of the present invention. It will be apparent to one skilled in the art that the present invention may be practiced without these specific details, and that equivalents to the present invention may be obtained without deviation from the essence of the present invention. Hence the present invention is not limited to the embodiments disclosed herein.

Figure 1:
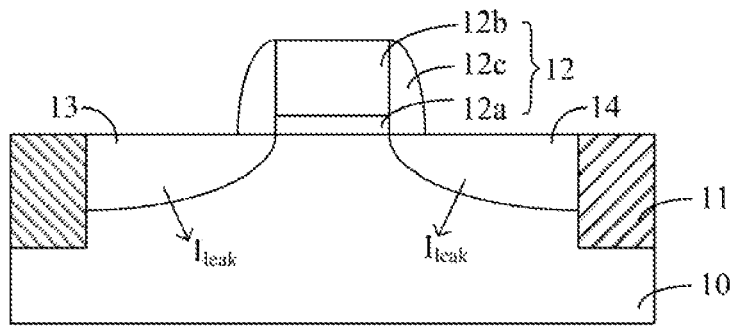
FIG. 1 is a cross-sectional structural diagram of an embedded source/drain MOS transistor in the prior art.
Figure 2:
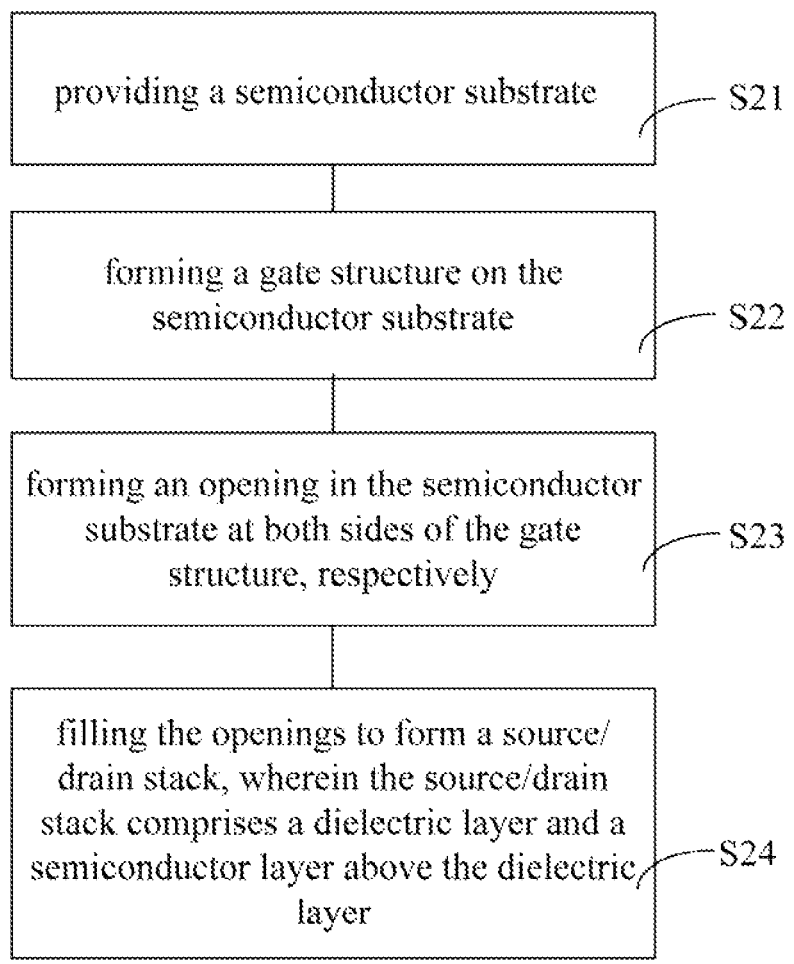
FIG. 2 is a flow chart of a method for forming an embedded source/drain MOS transistor according to an embodiment of the present invention.

FIG. 2 a flow chart of a method for forming an embedded source/drain MOS transistor according to an embodiment of the present invention, comprising:

step S21: providing a semiconductor substrate;

step S22: forming a gate structure on the semiconductor substrate;

step S23: forming an opening in the semiconductor substrate at each of the sides of the gate structure;

step S24: filling the opening to form a source/drain stack, wherein the source/drain stack comprises a dielectric layer and a semiconductor layer above the dielectric layer.

FIGS. 3-8 illustrate a method for forming an embedded source/drain MOS transistor according to an embodiment of the present invention with a cross-sectional view of the structure of an intermediate product. The embodiment is described in details below with reference to FIG. 2 and FIGS. 3-8.

Figure 3:
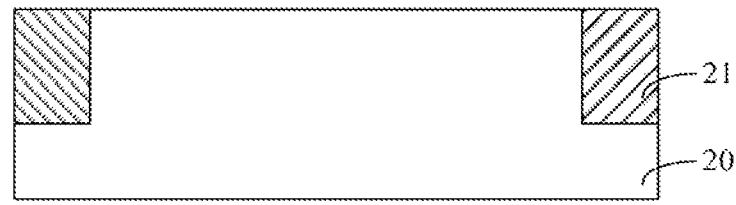
FIGS. 3 to 8 illustrate a method for forming an embedded source/drain MOS transistor according to an embodiment of the present invention with a cross-sectional view of the structure of an intermediate product.

As shown in FIG. 2 and FIG. 3, step S21 is performed: a semiconductor substrate 20 is provided. The semiconductor substrate 20 may be a silicon substrate, a silicon germanium substrate, a group III-V compound substrate, a carborundum substrate and a multi-layer structure thereof.

A shallow trench isolation structure 21 may also be formed in the semiconductor substrate 20, by: forming a trench in the semiconductor substrate 20 between adjacent embedded source/drain MOS transistors; filling the trench with a dielectric, which is preferably a crystal. In the case where the eventual transistor on the semiconductor substrate 20 between the shallow trench isolation structures 21 is a PMOS transistor, the lattice constant of the material filled in the shallow trench isolation structure 21 is larger than the lattice constant of the semiconductor substrate 20, thereby producing compressive stress and improving hole mobility; and in the case where the eventual transistor on the semiconductor substrate 20 between the shallow trench isolation structures 21 is an NMOS transistor, the lattice constant of the material filled in the shallow trench isolation structure 21 is less than the lattice constant of the semiconductor substrate 20, thereby producing tensile stress and improving electron mobility, hence, the performance of the device can be improved. In this embodiment, the shallow trench isolation structure 21 is formed before the device is formed; and in other embodiments, the shallow trench isolation 21 may be formed between the adjacent devices when the device has been formed.

Figure 4:
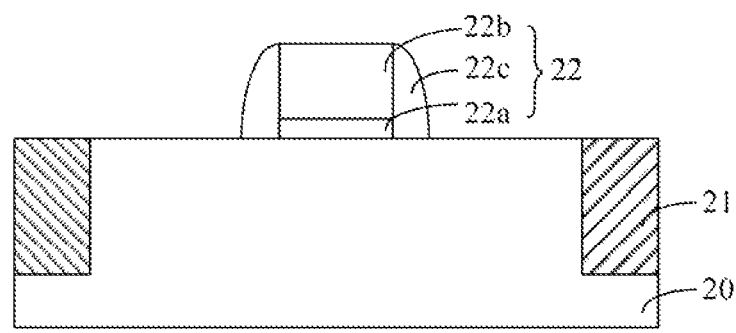

As shown in FIG. 2 and FIG. 4, step S22 is performed: a gate structure 22 is formed on the semiconductor substrate 20. This embodiment is gate-first. The gate structure 22 comprises a gate dielectric layer 22a on the semiconductor substrate 20, a gate electrode 22b on the gate dielectric layer 22a, and a spacer 22c enclosing the sidewalls of the gate dielectric layer 22a and the gate electrode 22b. The material of the gate dielectric layer 22a may be silicon oxide; the material of the gate electrode 22b may be polysilicon or doped polysilicon; and the material of the side wall 22c may be silicon oxide, silicon nitride or a multi-layer structure thereof. As a matter of course, the process may also be gate-last. In the case of gate-last, the gate structure 22 may be a dummy gate which comprises a dummy electrode, a gate dielectric layer and a spacer on the sidewalls of the gate dielectric layer and the dummy electrode. The gate structure 22 can be formed in a way well-known by those skilled in the art, which is therefore omitted herein.

Figure 5:
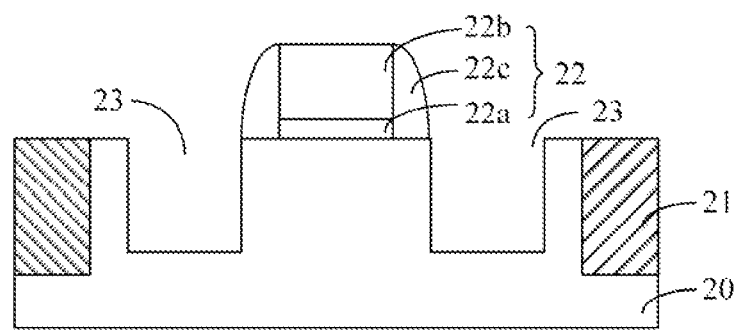

As shown in FIG. 2 and FIG. 5, step S23 is performed: an opening 23 is formed in the semiconductor substrate 20 at each of the sides of the gate structure 22. Specifically, the forming of the opening 23 may comprise common processes such as photolithography and etching. The opening 23 may be formed by dry etching or wet etching. In a preferred embodiment, by the selection of an etchant gas in dry etching, or, by dry etching first and then wet etching, the sidewall of the opening 23 formed protrudes outwards and extends to under the spacer 22c.

Figure 8:
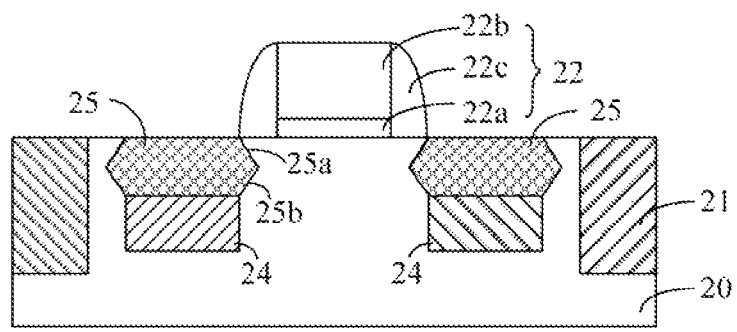

As shown in FIG. 2 and FIG. 8, step S24 is performed: the opening is filled to form a source/drain stack, wherein the source/drain stack comprises a dielectric layer 24 and a semiconductor layer 25 above the dielectric layer.

Figure 6:
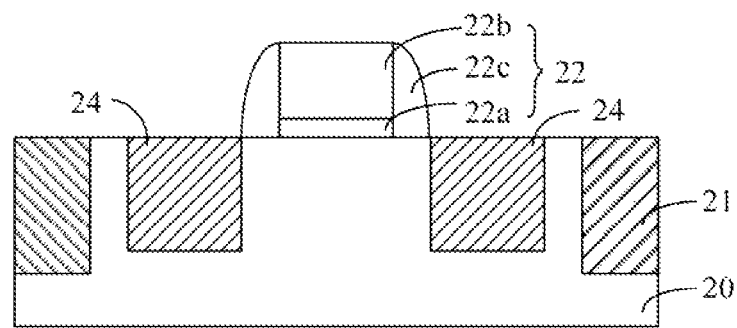

Specifically, with reference to FIG. 6, firstly, the opening is filled to form a dielectric layer 24, by, e.g., epitaxial growth, which may be vapor-phase epitaxial growth or solid-phase epitaxial growth. As a preferred embodiment, the material of the dielectric layer 24 may be a crystal, e.g., crystalline gadolinium oxide or crystalline neodymium oxide; and in forming of the dielectric layer 24, doping ions may be introduced so that the lattice constant of the formed the dielectric layer 24 is larger than or less than the lattice constant of the semiconductor substrate 20. Specifically, if a PMOS transistor is to be formed, the lattice constant of dielectric layer 24 is larger than the lattice constant of the semiconductor substrate 20; if an NMOS transistor is to be formed, the lattice constant of dielectric layer 24 is less than the lattice constant of the semiconductor substrate 20, hence, compressive stress or tensile stress will be produced in the channel region under the gate structure 22, and carrier mobility can be improved. As a matter of course, the material of the dielectric layer 24 may also be amorphous in other embodiments.

Figure 7:
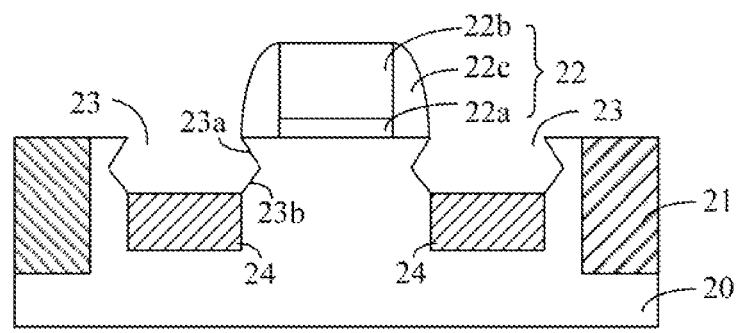

Then, with reference to FIG. 7, the surface portion of the dielectric layer 24 is etched, so that the upper surface of the remnant dielectric layer 24 is lower than the upper surface of the semiconductor substrate 20. During the etching process, by controlling etching rate and etching time, the depth of the opening 23 above the remnant dielectric layer 24 can be controlled, so that the depth conforms to the depth of the eventual source/drain region. Moreover, in the etching of the dielectric layer 24, the dielectric layer on the sidewall of the opening 23 above the remnant dielectric layer 24 may be removed, perverting the channel region from being affected by the dielectric layer when the source region and the drain region have been formed.

Preferably, in this embodiment, while the dielectric layer 24 is being etched, the semiconductor substrate 20 at the sidewall of the opening 23 may also be etched by adjustment of the etchant gas in dry etching, or, by dry etching first and then wet etching, so that the formed opening 23 extends to under the gate structure 22, e.g., to under the spacer 22c. Specifically, the sidewall of the opening 23 comprises an upper sidewall 23a and a lower sidewall 23b connected with each other, and the connection between the upper sidewall 23a and the lower sidewall 23b protrudes outwards, resulting in a diamond-shaped opening 23.

Then, reference is made to FIG. 8, a semiconductor layer 25 is formed on the remnant dielectric layer 24, and fills the opening above the remnant dielectric layer 24. The semiconductor layer 25 may be formed by epitaxial growth such as vapor-phase epitaxial growth and solid-phase epitaxial growth. The material of the semiconductor layer 25 may be a semiconductor, preferably a crystal, e.g., monocrystalline silicon, monocrystalline silicon germanium, monocrystalline carborundum. The semiconductor layer 25 acts as the source/drain region of the eventual embedded source/drain MOS transistor. The upper surface of the semiconductor layer 25 may be flushed with the upper surface of the semiconductor substrate 20, or higher than the upper surface of the semiconductor substrate 20 to form a raised source/drain structure, thereby reducing contact resistance.

In the process of forming the semiconductor layer 25, in-situ doping may be used to introduce doping ions. For PMOS transistors, P-type doping ions such as boron ions and indium ions may be introduced; and for NMOS transistors, N-type doping ions such as phosphorus ions and arsenic ions may be introduced.

Preferably, the material of the semiconductor layer 25 is a crystal, and for PMOS transistors, the lattice constant of the material of the semiconductor layer 25 is larger than the lattice constant of the semiconductor substrate 20, producing compressive stress in the channel region and improving hole mobility; and for NMOS transistors, the lattice constant of the material of the semiconductor layer 25 is less than the lattice constant of the semiconductor substrate 20, producing tensile stress in the channel region and improving electron mobility. Specifically, in this embodiment, the material of the semiconductor layer 25 is monocrystalline silicon, and for PMOS transistors, the material of the semiconductor layer 25 may be silicon germanium; and for NMOS transistors, the material of the semiconductor layer 25 may be carborundum. As a matter of course, in other embodiments, the material of the semiconductor layer 25 may be the same as the semiconductor substrate 20.

The semiconductor layer 25 may extend to under the gate structure 22, specifically, to under the side wall 22c. The morphology of the sidewall of the semiconductor layer 25 conforms to the morphology of the sidewall of the opening above the dielectric layer 24. The sidewall of the semiconductor layer 25 comprises an upper sidewall 25a and lower sidewall 25b connected with each other, with the connection protruding outwards, i.e., towards the channel region. This facilitates generation of stress in the channel region of the MOS transistor, and can improve carrier mobility.

The semiconductor layer 25 acts as the source/drain region of the eventual embedded source/drain MOS transistor. Due to the dielectric layer 24 is formed under the semiconductor layer 25, the path for the leakage current from the source/drain region to the semiconductor substrate 20 is cut off, thereby reducing the leakage current from the source region and the drain region to the semiconductor substrate 20 and reducing power consumption of the device.

Thus, as shown in FIG. 8, the structure of the embedded source/drain MOS transistor formed according to an embodiment of the present invention comprises: a semiconductor substrate 20; a gate structure 22 on the semiconductor substrate 20; and a source/drain stack embedded in the semiconductor substrate 20 at each of the sides of the gate structure 22, with the upper surface of the source/drain stack exposed, wherein the source/drain stack comprises a dielectric layer 24 and a semiconductor layer 25 on the dielectric layer 24, i.e., it is the upper surface of the semiconductor layer 25 that is exposed. In addition, a shallow trench isolation structure 21 is formed in the semiconductor substrate 20, specifically, in the semiconductor substrate 20 between adjacent embedded source/drain MOS transistors. The dielectric filled in the shallow trench isolation structure 21 may be a crystal.

In this embodiment, the gate structure 22 comprises a gate dielectric layer 22a on the semiconductor substrate 20, a gate electrode 22b on the gate dielectric layer 22a and a spacer 22c enclosing the sidewalls of the gate electrode 22b and the gate dielectric layer 22a. The material of the dielectric layer 24 and the material of the semiconductor layer 25 may be a crystal, and have a lattice constant greater than or less than the lattice constant of the semiconductor substrate 20 depending on the type of the eventual transistor. Please refer to the descriptions above for details. Moreover, the semiconductor layer 25 extends to under the gate dielectric layer 22a, and the sidewall of the semiconductor layer 25 comprises an upper side 25a and an lower side 25b connected with each other, with the connection protruding outwards, thereby facilitating increase of stress in the channel region.

Figure 9:
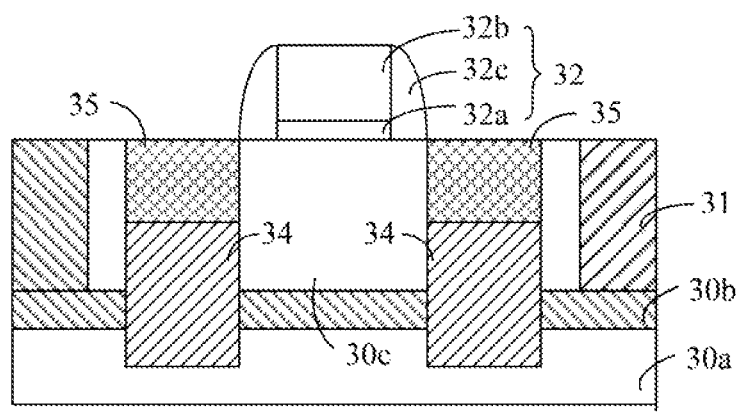
FIG. 9 is a cross-sectional view of a device formed according to a method for forming an embedded source/drain MOS transistor according to another embodiment of the present invention.

FIG. 9 is a cross-sectional view of a device formed according to a method for forming an embedded source/drain MOS transistor according to another embodiment of the present invention. The semiconductor substrate used in the embodiment is a silicon-on-insulator substrate which comprises a substrate 30a, a buried insulating layer 30b on the substrate 30a and a surface semiconductor material layer 30c on the buried insulating layer 30b. A shallow trench isolation structure 31 may be formed in the surface semiconductor material layer 30c. The embedded source/drain MOS transistor may further comprise: a gate structure 32, wherein the gate structure 32 comprises a gate dielectric layer 32a on the surface semiconductor material layer 30c, a gate electrode 32b on the gate dielectric layer 32a and a spacer 32c on the sidewalls of the gate dielectric layer 32a and the gate electrode 32b; a source/drain stack embedded in the semiconductor substrate at each of the sides of the gate structure 32, wherein the source/drain stack comprises a dielectric layer 34 and a semiconductor material layer 35 on the dielectric layer 34. In the embodiment, the source/drain stack goes through the surface semiconductor material layer 30c and the buried insulating layer 30b. In other embodiments, the source/drain stack may only embedded in the surface semiconductor material layer 30c on the buried insulating layer 30b, without going through the surface semiconductor material layer 30c and the buried insulating layer 30b. Whether the source/drain stack goes through the surface semiconductor material layer 30c and the buried insulating layer 30b or not can be determined by controlling whether the opening formed by etching the semiconductor substrate at the sides of the gate structure 32 goes through the surface semiconductor material layer 30c and the buried insulating layer 30b. Please refer to the previous embodiment for the materials and formation methods of the layers of the structure shown in FIG. 9, which are omitted here.

Preferred embodiments of the invention are disclosed above, which should not be interpreted as limiting the scope of the invention. Alternations and modifications can be made to the technical solution of the invention by those skilled in the art based on the technical disclosure herein without deviation from the scope of the invention. Therefore, any alternations, equivalents, or modifications made to the embodiments disclosed herein based on the technical essential of the invention without deviation from the scope of the invention should fall within the scope of the invention.

The invention claimed is:
1. An embedded source/drain metal-oxide-semiconductor (MOS) transistor comprising:
   a semiconductor substrate;
   a gate structure on the semiconductor substrate; and
   a source/drain stack embedded in the semiconductor substrate at both sides of the gate structure with an upper surface of the source/drain stack being exposed, wherein the source/drain stack comprises a dielectric layer and a semiconductor layer above the dielectric layer;

wherein the semiconductor layer extends to under the gate structure;

wherein sidewalls of the semiconductor layer comprise an upper sidewall and a lower sidewall connected with each other, and the connection between the upper sidewall and the lower sidewall protrudes outwards from the semiconductor layer.

2. The embedded source/drain MOS transistor according to claim 1, wherein the material of the dielectric layer and/or the semiconductor layer comprises crystal materials.

3. The embedded source/drain MOS transistor according to claim 2, wherein the semiconductor layer is P-type doped, and the dielectric layer and/or the semiconductor layer has a lattice constant larger than that of the semiconductor substrate.

4. The embedded source/drain MOS transistor according to claim 2, wherein the semiconductor layer is N-type doped, and the dielectric layer and/or the semiconductor layer has a lattice constant less than that of the semiconductor substrate.

5. The embedded source/drain MOS transistor according to claim 2, wherein the material of the dielectric layer comprises crystalline gadolinium oxide or crystalline neodymium oxide.

6. The embedded source/drain MOS transistor according to claim 1, wherein an upper surface of the semiconductor layer is flushed with or higher than an upper surface of the semiconductor substrate.

7. The embedded source/drain MOS transistor according to claim 1, wherein the semiconductor substrate is a silicon-on-insulator substrate, and wherein the silicon-on-insulator substrate comprises a substrate, a buried insulating layer on the substrate and a surface semiconductor material layer on the buried insulating layer, the gate structure is formed on the surface semiconductor material layer, and the source/drain stack is embedded in the surface semiconductor material layer on the buried insulating layer, or penetrates through the surface semiconductor material layer and the buried insulating layer.

* * * * *